US009398680B2

(12) United States Patent
Davis

(10) Patent No.: US 9,398,680 B2
(45) Date of Patent: Jul. 19, 2016

(54) IMMERSIBLE PLASMA COIL ASSEMBLY AND METHOD FOR OPERATING THE SAME

(75) Inventor: Matthew Davis, Felton, CA (US)

(73) Assignee: Lam Research Corporation, Fremont, CA (US)

( * ) Notice: Subject to any disclaimer, the term of this patent is extended or adjusted under 35 U.S.C. 154(b) by 1237 days.

(21) Appl. No.: 12/959,653

(22) Filed: Dec. 3, 2010

(65) Prior Publication Data

US 2012/0138450 A1 Jun. 7, 2012

(51) Int. Cl.
| | |
|---|---|
| *H01L 21/3065* | (2006.01) |
| *C23C 16/505* | (2006.01) |
| *H05H 1/46* | (2006.01) |
| *H01J 37/32* | (2006.01) |

(52) U.S. Cl.
CPC ............... *H05H 1/46* (2013.01); *H01J 37/321* (2013.01); *H01J 37/3211* (2013.01); *C23C 16/505* (2013.01); *H05H 2001/4667* (2013.01)

(58) Field of Classification Search
None
See application file for complete search history.

(56) References Cited

U.S. PATENT DOCUMENTS

| | | | | |
|---|---|---|---|---|
| 5,522,934 | A | * | 6/1996 | Suzuki et al. ........... 118/723 AN |
| 5,683,537 | A | * | 11/1997 | Ishii ........................ 156/345.33 |
| 5,968,327 | A | | 10/1999 | Kobayashi et al. |
| 6,072,147 | A | * | 6/2000 | Koshiishi et al. ........ 219/121.43 |
| 6,192,829 | B1 | | 2/2001 | Karazim et al. |
| 6,209,480 | B1 | * | 4/2001 | Moslehi .................... 118/723 I |
| 6,245,202 | B1 | * | 6/2001 | Edamura et al. ......... 204/298.06 |
| 6,537,418 | B1 | * | 3/2003 | Muller et al. ............. 156/345.34 |
| 6,935,269 | B2 | * | 8/2005 | Lee et al. .................. 118/723 I |
| 7,482,757 | B2 | | 1/2009 | Quon et al. |
| 2001/0047760 | A1 | | 12/2001 | Moslehi |
| 2003/0209324 | A1 | * | 11/2003 | Fink ........................ 156/345.48 |
| 2006/0260937 | A1 | | 11/2006 | Miller et al. |
| 2009/0008239 | A1 | | 1/2009 | Sorensen et al. |
| 2009/0297730 | A1 | * | 12/2009 | Glukhoy et al. ............... 427/571 |

OTHER PUBLICATIONS

International Search Report and Written Opinion for PCT/US2011/060824, mailed on Mar. 8, 2012.

* cited by examiner

*Primary Examiner* — Keath Chen
*Assistant Examiner* — Aiden Lee
(74) *Attorney, Agent, or Firm* — Martine Penilla Group, LLP

(57) ABSTRACT

A coil assembly includes an encapsulation structure having a coil placement region formed therein. One or more access ports are formed through the encapsulation structure to the coil placement region. The coil placement region is hermetically sealed by the encapsulation structure outside of the one or more access ports. A coil device is disposed within the coil placement region within the encapsulation structure. Terminals of the coil device are accessible through the one or more access ports formed through the encapsulation structure. The encapsulation structure is formed of a material suitable for exposure to a plasma. The coil assembly can be disposed inside of a plasma processing chamber and above a support structure, such that the coil assembly is in exposure to a plasma generated between the coil assembly and the support structure by radiofrequency power supplied to the coil device within the coil assembly.

34 Claims, 10 Drawing Sheets

View A-A

View B-B

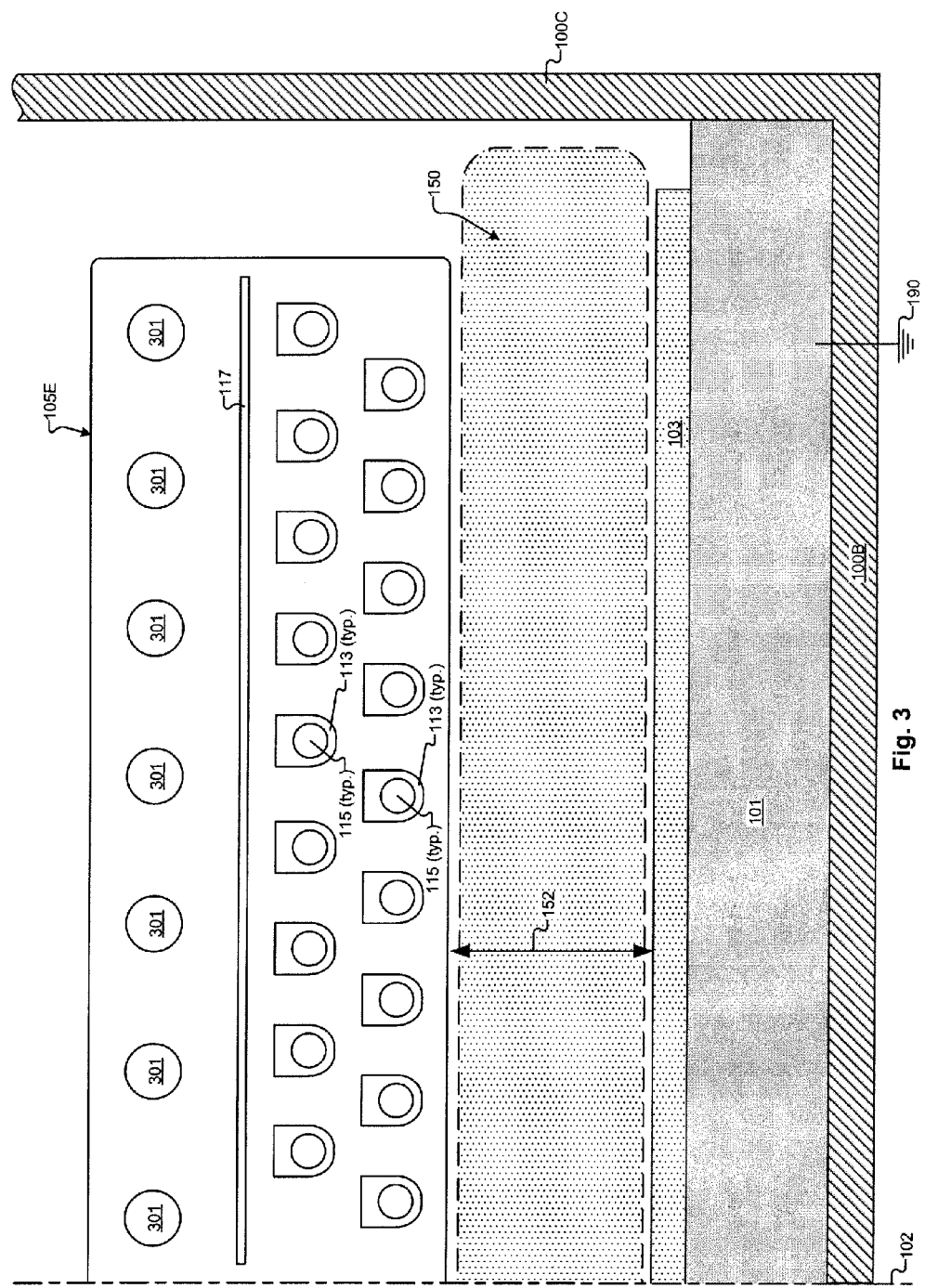

IMMERSIBLE PLASMA COIL ASSEMBLY AND METHOD FOR OPERATING THE SAME

BACKGROUND OF THE INVENTION

Conventional transformer coupled plasma (TCP) processing chambers utilize a source coil disposed outside of the chamber and above an upper window of the chamber. In this configuration, the source coil is separated from the plasma processing environment within the chamber. Also in this configuration, radiofrequency (RF) power is supplied to the source coil to generate an RF electromagnetic field that must extend through the window and into the chamber to strike and sustain a plasma within the chamber. A large RF current must be supplied to the source coil above the window in order to generate an RF electromagnetic field within the chamber that is sufficient to strike and sustain the plasma. However, use of such large RF currents can have side-effects such as creation of high-intensity electric fields, capacitive coupling, and corresponding ion bombardment on the window, which can cause erosion of the window.

Also, the position of the source coil outside of the chamber and above the window causes the source coil to be positioned at a relatively remote location from the substrate to be processed. The remote location of the source coil from the substrate can cause a reduction in the achievable plasma density at the substrate level due to the relatively large diffusion distance for neutral species and ions within the plasma. Also, the window configuration can cause a reduction/limitation of the anode area of the chamber, which can cause a decrease in the anode-to-cathode area ratio of the chamber, which in turn can result in higher than desirable plasma potential. Additionally, use of the window itself introduces complexity to the chamber in that the window needs to achieve a high temperature through direct heating or through process-induced heating in order to keep the chamber in equilibrium, so as to avoid "first wafer effects."

In addition to the above, as the substrate size increases, the plasma chamber size is required to increase in a corresponding manner. Increasing the chamber size requires an increase in the window size. Because the window must be capable of withstanding a high pressure differential between the inside of the chamber at vacuum pressure and the outside of the chamber at atmospheric pressure, an increase in the window size requires an increase in the window thickness. The increased window thickness will require the source coil positioned outside of the chamber and above the window to be excited with even higher RF currents and power levels to obtain a sufficient energy transfer to the plasma within the increased size chamber. Thus, the issues noted above with regard to high RF currents may become even more pronounced with the increased size chamber.

SUMMARY OF THE INVENTION

In one embodiment, a coil assembly for plasma generation is disclosed. The coil assembly includes an encapsulation structure having a coil placement region formed therein. One or more access ports are formed through the encapsulation structure to the coil placement region. The coil placement region is hermetically sealed by the encapsulation structure outside of the one or more access ports. The coil assembly also includes a coil device disposed within the coil placement region within the encapsulation structure. Terminals of the coil device are accessible through the one or more access ports formed through the encapsulation structure. The encapsulation structure is formed of a material suitable for exposure to a plasma to be generated by the coil device.

In another embodiment, a system is disclosed for plasma processing of a substrate. The system includes a chamber having a bottom structure, a top structure, and an enclosing side structure between the bottom and the top structures, so as to form an interior volume within the chamber. The system also includes a support structure disposed within the interior volume of the chamber. The support structure is defined to support a substrate during plasma processing of the substrate. The system further includes a coil assembly positioned within the interior volume of the chamber and above the support structure. The coil assembly includes a coil device disposed within an hermetically sealed region within an encapsulation structure. The encapsulation structure is formed of a material suitable for exposure to a plasma to be generated within the interior volume of the chamber between the coil assembly and the support structure.

In another embodiment, a method is disclosed for plasma processing of a substrate. The method includes placing a substrate on a support structure within a plasma processing chamber. The method also includes positioning a coil assembly within the plasma processing chamber above the support structure. The coil assembly includes a coil device disposed within an hermetically sealed region within an encapsulation structure. The encapsulation structure is formed of a material suitable for exposure to a plasma to be generated by the coil device within the plasma processing chamber. The method also includes flowing a reactant gas to a plasma generation region within the plasma processing chamber between the coil assembly and the support structure. The method further includes transmitting radiofrequency (RF) power to the coil device within the coil assembly. The RF power transforms the reactant gas into a plasma within the plasma generation region, such that the coil assembly is in direct exposure to the plasma.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 3 shows a vertical half cross-section of an alternative coil assembly including a stacked arrangement of coil devices, in accordance with one embodiment of the present invention;

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
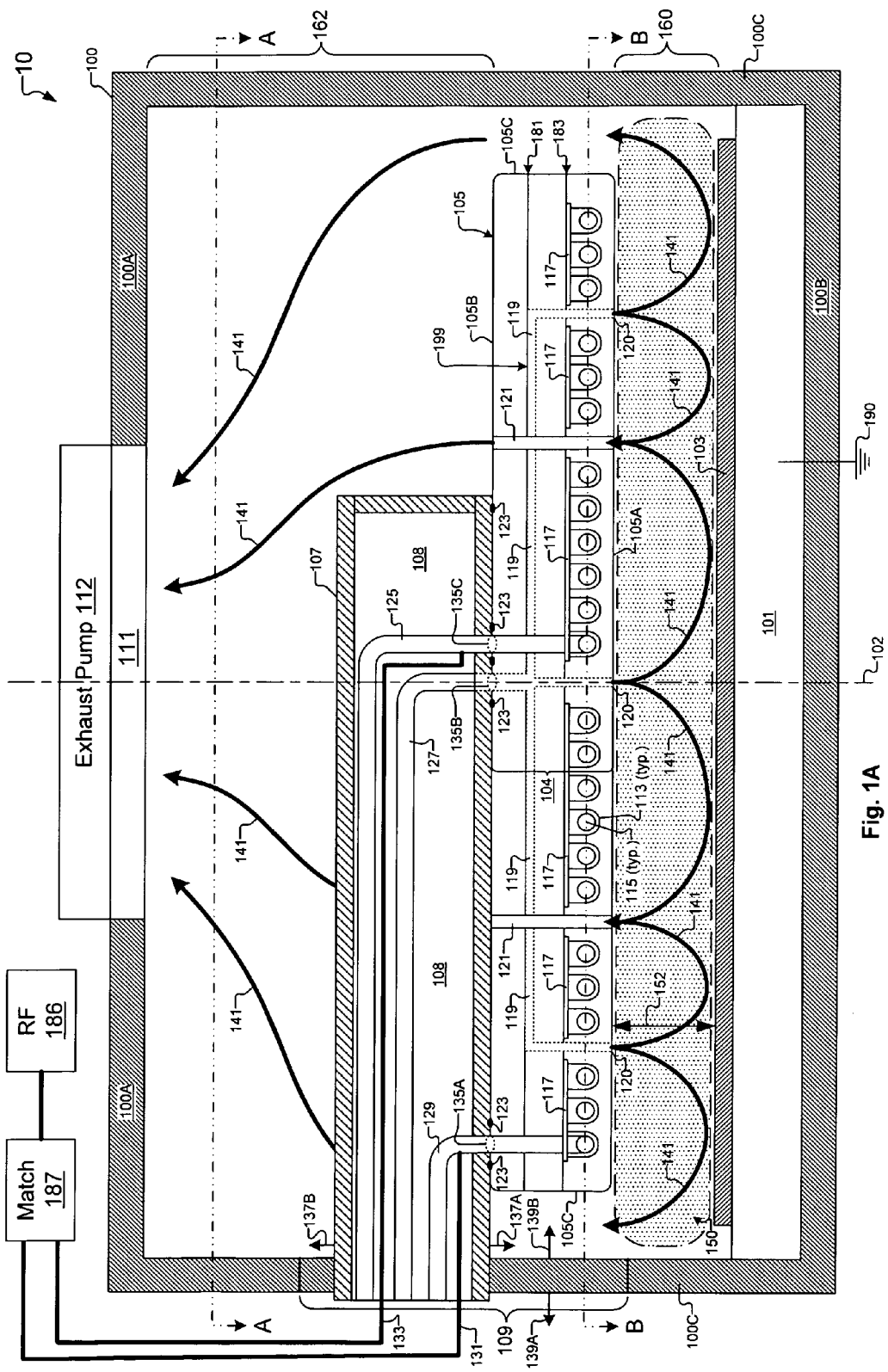
FIG. 1A shows a system for plasma processing of a substrate, in accordance with one embodiment of the present invention.

FIG. 1A shows a system 10 for plasma processing of a substrate 103, in accordance with one embodiment of the present invention. The system 10 includes a chamber 100 having a bottom structure 100B, a top structure 100A, and an enclosing side structure 100C disposed between the bottom structure 100B and the top structure 100A. For reference, a centerline 102 of the chamber 100 is shown. In one embodiment, the chamber 100 structure is formed of a metallic material having a high thermal conductivity. In this embodiment, the chamber 100 can be operated at a desired setpoint temperature without regard for process induced heating.

An interior volume of the chamber 100 is delineated into a lower region 160 and an upper region 162, demarcated by a coil assembly 105 for plasma generation. The lower region 160 of the chamber exists between a substrate support structure 101 and the coil assembly 105. The upper region 162 of the chamber exists between the coil assembly 105 and the top structure 100A of the chamber 100. The coil assembly 105 is sized to allow an outer peripheral gas flow region between the coil assembly 105 and the enclosing side structure 100C of the chamber 100 over the distance extending between the lower 160 and upper 162 regions of the chamber 100. Also, as discussed further below, the coil assembly 105 includes a number of through holes/slots 121 to provide for gas flow through the coil assembly 105 from the lower region 160 to the upper region 162 within the chamber 100.

The substrate support structure 101 is disposed within the interior volume of the chamber 100 and is defined to support the substrate 103 during performance of plasma processing thereon. In one embodiment, the substrate support structure 101 is a pedestal defined to hold the substrate 103 securely during plasma processing. In another embodiment, the substrate support structure 101 is an electrostatic chuck defined to hold the substrate 103 by generating electrostatic attraction forces. It should be understood that the substrate support structure 101 can be defined in essentially any manner so long as the substrate support structure 101 provides for secure holding of the substrate 103 during plasma processing thereof. Also, in one embodiment, the substrate support structure 101 can be defined to include cooling fluid flow channels for temperature control of the substrate 103. And, in one embodiment, the substrate support structure 101 can be defined to include bias voltage generation devices that can be operated to attract charged particles within the plasma toward the substrate 103, and/or repel charged particles within the plasma away from the substrate 103.

The substrate support structure 101 and chamber 100 are defined to receive and process substrates 103 of various size diameter, such as 300 mm (millimeter) or 450 mm, among others. As described herein, the coil assembly 105 is defined to be scalable in size, such that the chamber 100, substrate support structure 101, and coil assembly 105 can be either increased or decreased in size as necessary to accommodate substrates 103 of essentially any size diameter.

In the embodiment of FIG. 1A, the upper region 162 of the chamber 100 is fluidly connected to an exhaust pumping port 111 formed in a central location in the top structure 100A of the chamber 100. An exhaust pump 112 is disposed outside of the chamber 100 and is fluidly connected to the exhaust pumping port 111. The exhaust pump 112 is defined to remove gases from the interior volume of the chamber 100, as indicated by arrows 141.

The coil assembly 105 is positioned within the interior volume of the chamber 100, above the substrate support structure 101. In this manner, the coil assembly 105 is disposed in direct exposure to a plasma 150 generated within the interior of the chamber 100 between the coil assembly 105 and the substrate support structure 101. The coil assembly 105 includes a coil device 115 disposed within an hermetically sealed region 113 within an encapsulation structure 104. The encapsulation structure 104 is formed of a material suitable for exposure to the plasma 150 to be generated within the interior volume of the chamber 100 between the coil assembly 105 and the substrate support structure 101, i.e., between the coil assembly 105 and the substrate 103 when present on the substrate support structure 101.

The hermetically sealed coil placement region 113 formed within the encapsulation structure 104 includes one or more access ports 135A, 135C formed through the encapsulation structure 104 to the coil placement region 113. The coil placement region 113 is hermetically sealed by the encapsulation structure 104 outside of the one or more access ports 135A, 135C. Terminals 129, 125 of the coil device 115 are accessible through the one or more access ports 135A, 135C formed through the encapsulation structure 104. It should also be understood that the coil assembly 105 can include internal passages for process gas flow, cooling gas/fluid flow, connectors, etc.

Because the coil assembly 105 is placed within the chamber 100, i.e., immersed in the plasma generation environment, the coil assembly 105 can be placed in much closer proximity to the substrate 103, as compared to conventional coils that are disposed outside the chamber above a window. Also, a vertical position of the coil assembly 105 relative to the substrate support structure 101 can be adjustable, such that a separation distance 152 between the coil assembly 105 and the substrate 103 can be adjusted.

By immersing the coil assembly 105 within the chamber 100, the separation distance 152 can be made very small, e.g., 1 cm or less. The small separation distance 152 allows for use of a lower RF current on the coil device 115 to obtain an adequate plasma density over the substrate 103. Therefore, the small separation distance 152 allows for use of a lower RF power to sustain the plasma 150. Use of a lower RF current in turn reduces a heating of the coil device 115 and coil assembly 105.

Also, use of a lower RF current provides for a reduction in induced RF voltage and correspondingly lower capacitive coupling between the coil device 115 and the plasma 150. The capacitive coupling between the coil device 115 and the plasma 150 drives ion bombardment of the coil assembly 105, which can result in sputtering of contaminants onto the substrate 103. Therefore, the small separation distance 152 achievable between the coil assembly 105 and the substrate 103 allows for use of a reduced RF current, which in turn reduces capacitive coupling between the coil assembly 105 and plasma 150, and correspondingly reduces sputtering of contaminants from the coil assembly 105 onto the substrate 103. Thus, the immersed coil assembly 105 provides for reduced substrate 103 contamination and improved defectivity control on the substrate 103.

Additionally, it should be understood that the immersible coil assembly 105 eliminates the need to couple electromagnetic fields through a physical structure, such as a quartz window of a chamber. Therefore, with the immersible coil assembly 105, the plasma excitation can be run in a lower impedance mode with lower RF currents and correspondingly lower RF voltages, thereby providing higher plasma density in closer proximity to the substrate 103. Generation of higher plasma density in closer proximity to the substrate 103 in turn provides for increased etch rates and improved control of plasma processing parameters associated with the precision of critical dimension (CD) control of features formed on the substrate 103.

Because the coil assembly 105 is disposed inside of the chamber 100, it is not restricted in size by a chamber window structure. Therefore, the size of the coil assembly 105 can be increased relative to the size of the substrate support structure 101. In this configuration, the sides and top of the chamber 100 represent the anode, and the substrate support structure 101 represents the cathode. So, with the immersed coil assembly 105, the anode-to-cathode surface area ratio can be increased, relative to chambers that required placement of a coil outside of the chamber opposite a window structure. Because plasma potential is inversely proportional to the anode-to-cathode area, the increase in anode-to-cathode area afforded by the immersed coil assembly 105 provides for a reduced plasma potential. This reduced plasma potential provides a reduction in ion bombardment on the coil assembly 105, which reduces material sputtering from the coil assembly 105 and correspondingly reduces contamination of the substrate 103.

Figure 1B:
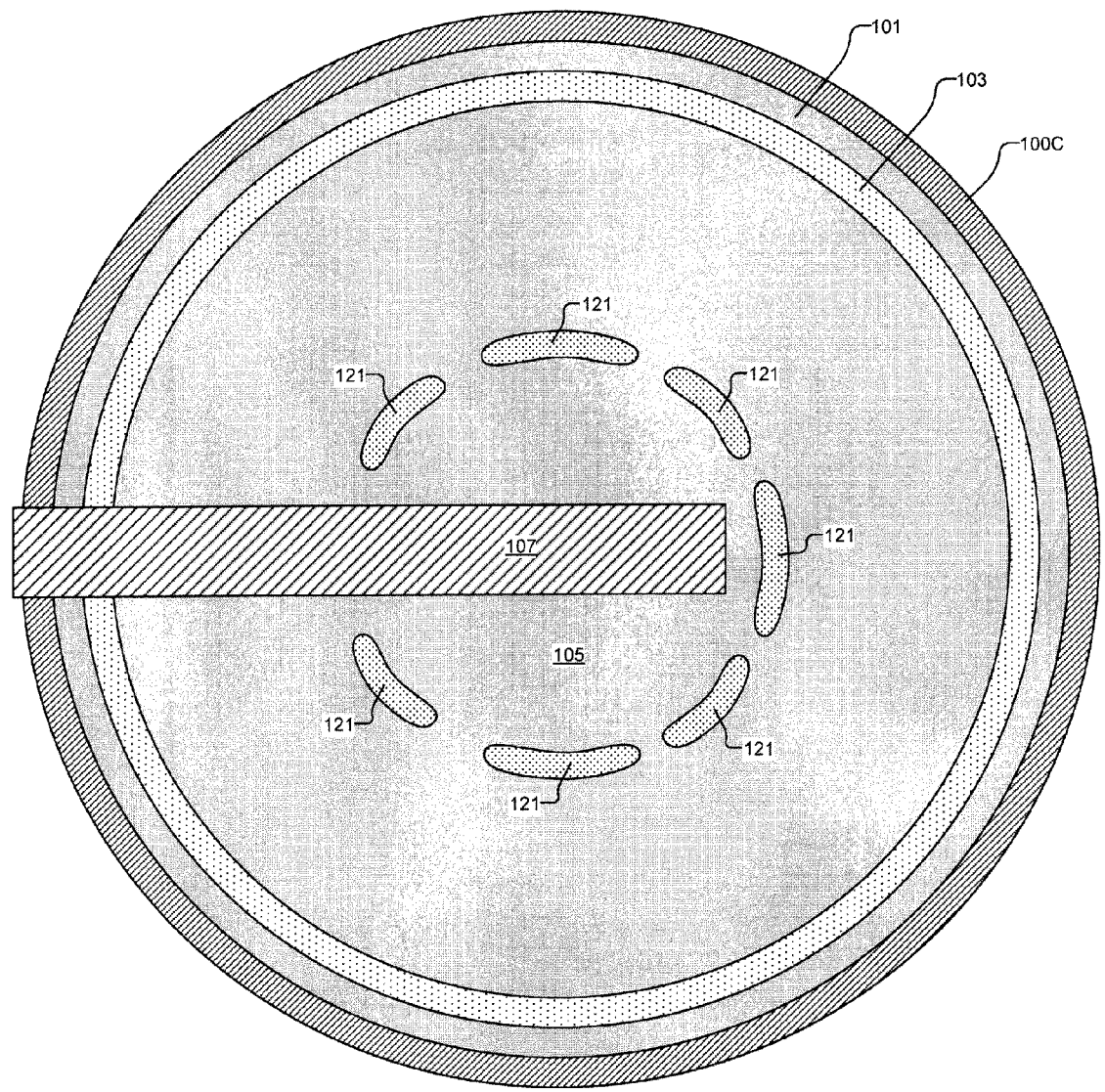
FIG. 1B shows a top view of the cantilevered support relative to the coil assembly, as referenced by View A-A of FIG. 1A, in accordance with one embodiment of the present invention.

With reference to FIG. 1A, in one embodiment, the coil assembly 105 is held by a cantilevered support 107 above and substantially parallel to the support structure 101 within the chamber 100. The cantilevered support 107 is defined to extend through the enclosing side structure 100C of the chamber 100. The cantilevered support 107 is affixed to a portion of the top surface of the encapsulation structure 104 of the coil assembly 105. FIG. 1B shows a top view of the cantilevered support 107 relative to the coil assembly 105, as referenced by View A-A of FIG. 1A, in accordance with one embodiment of the present invention.

The cantilevered support 107 is connected to the coil assembly 105 in a sealed manner, as indicated by seals 123. This allows an interior volume 108 of the cantilevered support 107 and a sealed interior volume of the coil assembly 105, e.g., the hermetically sealed coil placement region 113, to be isolated from the interior of the chamber 100 in which plasma processing occurs. In one embodiment, the cantilevered support 107 is defined to withstand a pressure differential between its interior volume 108 and the interior volume of the chamber 100, when the interior volume 108 of the cantilevered support 107 is exposed to an atmospheric pressure as a pressure within the interior volume of the chamber 100 is raised or lowered relative to the atmospheric pressure.

A portion of a top surface 105B of the encapsulation structure 104 includes a number of access ports 135A-C to interior regions of the encapsulation structure 104. Each of the access ports 135A-C is in open communication with the interior volume 108 of the cantilevered support 107 through corresponding holes formed within the cantilevered support 107. The cantilevered support 107 is hermetically sealed with the encapsulation structure 104 around each of the number of access ports 135A-C, as indicated by seals 123, such that the interior volume 108 of the cantilevered support 107 and the interior regions of the encapsulation structure 104 are isolated from the interior volume of the chamber 100.

The sealed pressure boundary provided by the cantilevered support 107 allows for various connections to the coil assembly 105 to be maintained within an atmospheric pressure environment that is isolated from the plasma processing environment within the chamber 100. This configuration provides for easy atmospheric pressure region access through the cantilevered support 107 to the various coil assembly 105 connections. Additionally, maintaining the higher atmospheric pressure within the hermetically sealed coil placement region 113 of the coil assembly 105, relative to the lower interior pressure of the chamber 100, serves to suppress undesirable discharge from the coil device 115 within the hermetically sealed coil placement region 113.

In one embodiment, a section 109, e.g., access plate, of the enclosing side structure 100C of the chamber is movable to enable removal/insertion of the cantilevered support 107 and coil assembly 105 affixed thereto from/into the chamber 100, and indicated by arrows 139A and 139B, respectively. This enables the cantilevered support 107 and coil assembly 105 to be slid out of the chamber 100 for servicing/maintenance. Also, in one embodiment, the cantilevered support 107 is defined to be movable in a controlled manner in directions toward and away from the substrate support structure 101, as indicated by arrows 137A and 137B, respectively, to enable adjustment of the separation distance 152 between the coil assembly 105 and the substrate support structure 101.

In one embodiment, the encapsulation structure 104 of the coil assembly 105 is defined to have a disc shape, including a bottom surface 105A oriented to face the substrate support structure 101, a top surface 105B, and a peripheral side surface 105C extending between the bottom 105A and top 105B surfaces. The encapsulation structure 104 is formed of a material that is compatible with the plasma processing environment and that is structurally capable of withstanding pressures and forces to which it is exposed during plasma processing operations. In one embodiment, the encapsulation structure 104 is formed of a ceramic material, such as yttrium oxide or aluminum oxide, among others. Also, in one embodiment, an exterior spray coating is applied to the encapsulation structure 104 to provide increased protection from plasma erosion. This spray coating may be a ceramic coating, or can be essentially any other material coating that is resistant to plasma erosion and that is chemically compatible with the plasma processing environment within the chamber 100.

In one embodiment, the coil assembly 105 is formed as a stacked brazement of ceramic parts. For instance, in FIG. 1A, the coil assembly 105 may be formed as a stack of three ceramic plates connected by brazement interfaces 181 and 183. Each ceramic plate can be formed as necessary to accommodate structures to be placed within the coil assembly 105, such as the coil device 115, Faraday shields 117, gas flow channels 119, and through holes/slots 121, among others. The brazement interfaces 181 and 183 may be formed of a brazing material, which when fired will fuse the adjacent ceramic plates together. During the brazing process, the brazing material is reduced such that it bonds to the ceramic material to form an hermetic seal. In one embodiment, the brazing material is an aluminum-copper (Al—Cu) alloy used with molybdenum-manganese (Mo—Mn) process. However, in other embodiments, different brazing materials can be utilized, so long as the brazing material serves to fuse the ceramic plates together in an hermetically sealed manner.

In one embodiment, the brazing material is recessed from the peripheral side surface 105C of the encapsulation structure 104, to reduce the potential for plasma erosion of the brazing material and corresponding contamination of the substrate 103. As previously mentioned, following the brazing process, the encapsulation structure 104 can be coated with a plasma erosion resistance material, which can be applied to cover any exposed portion of the brazement interfaces 181 and 183. Additionally, although FIG. 1A shows a 3-part brazement configuration for the encapsulation structure 104, it should be understood that other embodiments may utilize essentially any brazement configuration, i.e., number of parts, as necessary to accommodate the particular internal design of the coil assembly 105.

The encapsulation structure 104 is formed to include the hermetically sealed coil placement region 113, within which the coil device 115 is disposed during manufacturing of the coil assembly 105. The hermetically sealed coil placement region 113 is defined to accommodate an anticipated differential thermal expansion between the coil device and the encapsulation structure 104 during operation at high temperature. In one embodiment, the coil device 115 can be in brazed contact with the encapsulation structure 104. However, in other embodiments, the coil device 115 can be held in a suspended manner within the hermetically sealed coil placement region 113, such that a gap exists between the coil device 115 and the encapsulation structure 104. In this embodiment, because the hermetically sealed coil placement region 113 can be maintained at atmospheric pressure, in contrast to the lower internal pressure of the chamber 100, the coil device 115 will be exposed to the higher atmospheric pressure, which will assist in suppressing undesirable discharge between the coil device 115 and the encapsulation structure 104.

In one embodiment, the coil device 115 is defined as an electrically conductive solid material. In another embodiment, the coil device 115 is defined as an electrically conductive tubing material. For example, the coil device 115 may be formed of copper tubing material or some other type of metallic tubing material. In one version of this embodiment, an interior of the coil device 115 tubing material serves as a cooling channel to contain a flow of the cooling fluid. It should be appreciated, however, that in other embodiments the coil device 115 can be defined in essentially any manner so long as the coil device is capable of transmitting the required RF power and is materially compatible with the encapsulation structure 104 and any cooling fluids to which it may be exposed.

The coil device 115 includes terminals connected to receive RF power through a respective number of electrical conductors 131 and 133. The RF power is generated by an RF power source 186 and is transmitted through an RF matching device 187 to the number of electrical conductors 131 and 133. The RF matching device 187 is defined to provide appropriate impedance matching to ensure that the RF power is properly transmitted from the coil device 115/coil assembly 105 to a load, i.e., to the plasma 150. The RF power is transmitted from the coil device 115/coil assembly 105, through the plasma generation region between the coil assembly 105 and the substrate support structure 101, to the substrate support structure 101, which is maintained at a controlled electric potential relative to a reference ground 190. In one embodiment, the chamber 100 serves as the reference ground.

In one embodiment, the electrical conductors 131, 133 are defined to extend through the interior volume 108 of the cantilevered support 107 from the RF matching device 187 to the terminals of the coil device 115 so as to convey RF power to the coil device 115. In this embodiment, the access ports provided through the cantilevered support 107 to the coil assembly 105 includes coil device 115 terminal ports to enable connection of the electrical conductors 131, 133 to the terminals of the coil device 115 disposed within the hermetically sealed region 113 within the encapsulation structure 104.

The coil device 115 serves as an inductively coupled plasma power source. In this regard, the coil device 115 transmits RF power to the plasma generation volume between the coil assembly 105 and the substrate support structure 101, which is connected to ground 190, thereby exciting a reactant gas present within the plasma generation volume to transform the reactant gas into the plasma 150. As an inductively coupled plasma power source, the coil device 115 provides for generation of high density plasmas without generation of high electromagnetic fields, which provides for substrate plasma processing with low device damage potential. The high density plasma generated by the coil device 115 is particularly useful for conductor etch applications, but can be used for essentially any type of plasma processing of the substrate 103.

Figure 1C:
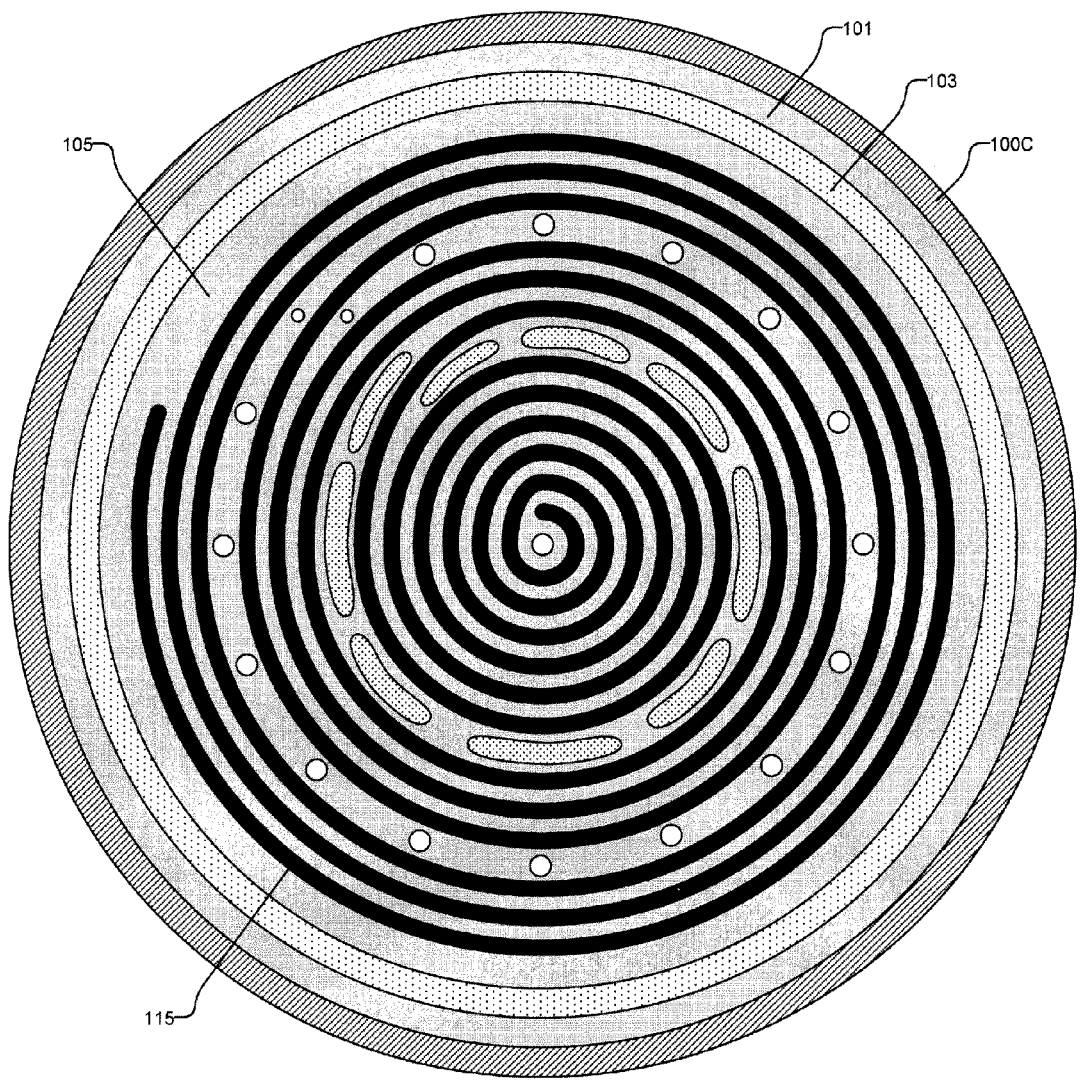
FIG. 1C shows a horizontal cut view through the coil device, as referenced by View B-B of FIG. 1A, in accordance with one embodiment of the present invention.

FIG. 1C shows a horizontal cut view through the coil device 115, as referenced by View B-B of FIG. 1A, in accordance with one embodiment of the present invention. As shown in FIG. 1C, the coil device 115 is a single, continuous winding within the coil assembly 105. It should be understood, however, that the coil device 115 and the associated coil assembly 105 can be defined in many different ways in different embodiments. For example, the coil assembly 105 can include multiple independently controllable coil devices 115. These multiple coil devices 115 can occupy separate regions across the coil assembly 105, and correspondingly across the substrate 103. Also, these multiple coil devices 115 can be interleaved to provide for smearing of coil end effects. This interleaving of the coil devices 115 can also be done on a regionalized/zoned basis within the coil assembly 105. Additionally, multiple coil devices 115 can be used in the coil assembly 105 for respective multiple phases of RF power. Moreover, the geometry of the coil devices 115, i.e., the intercoil spacing, can be optimized to provide a solution for conductance restriction for the purpose of optimizing plasma confinement, plasma residence time, etc.

Figure 2A:
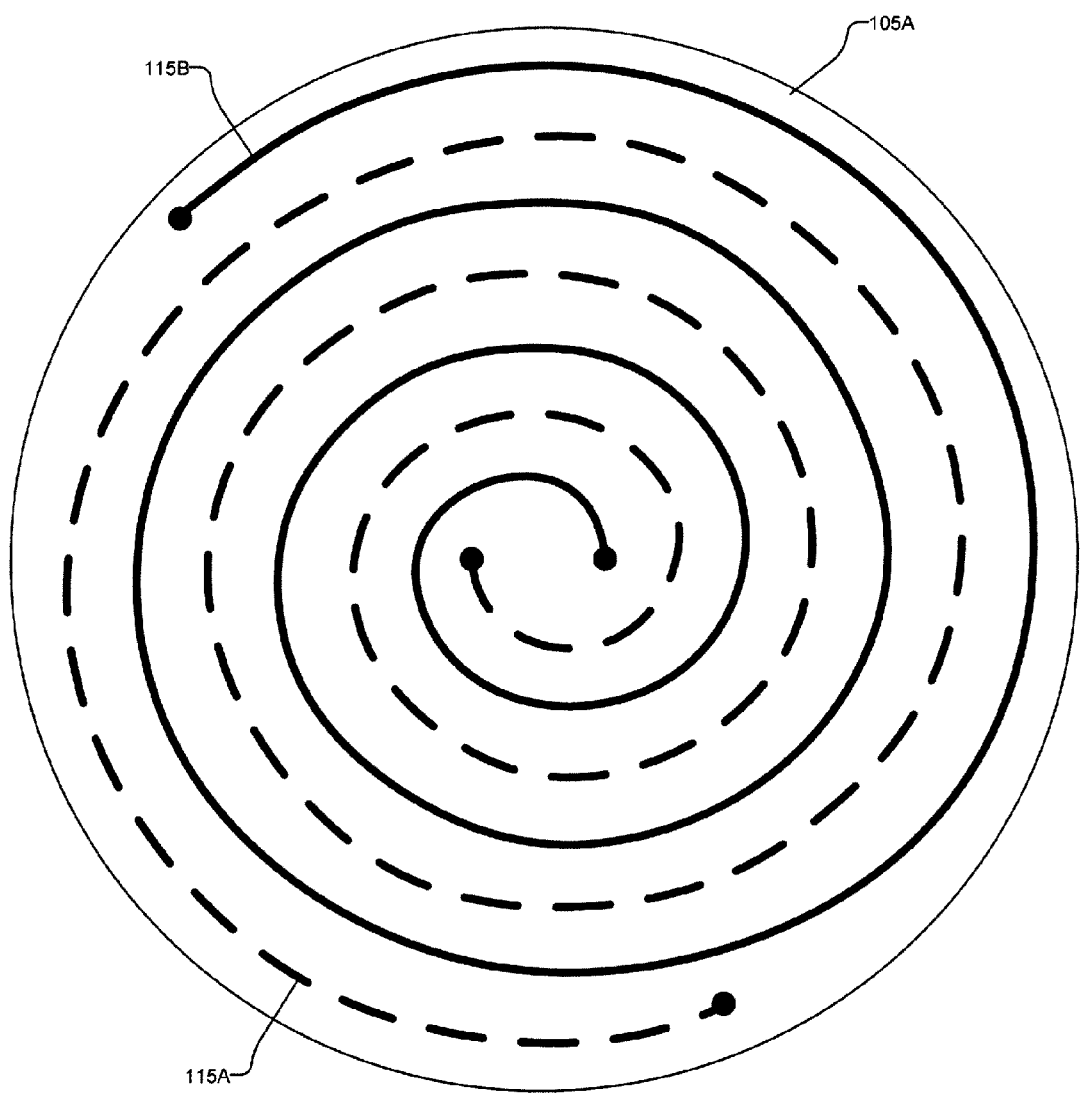
FIG. 2A shows an example coil assembly in which two interleaved coil devices are disposed within a single zone, in accordance with one embodiment of the present invention.
Figure 2B:
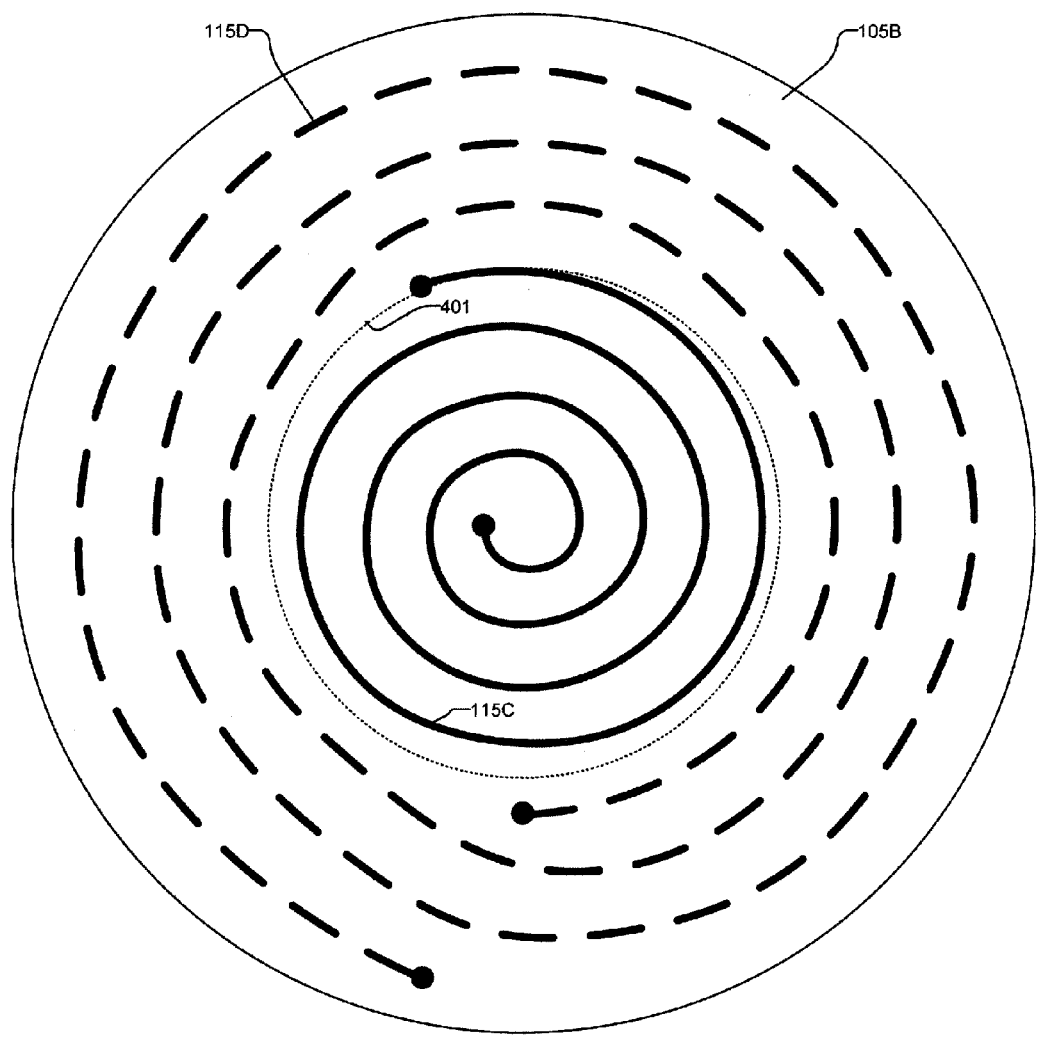
FIG. 2B shows an example coil assembly in which separate coil devices are disposed within separate zones, in accordance with one embodiment of the present invention.

FIG. 2A shows an example coil assembly 105A in which two interleaved coil devices 115A and 115E are disposed within a single zone, in accordance with one embodiment of the present invention. FIG. 2B shows an example coil assembly 105B in which separate coil devices 115C and 115D are disposed within separate zones, in accordance with one embodiment of the present invention. The separate zones in FIG. 2B include an inner zone and an outer zone delineated by a zone boundary 401.

Figure 2C:
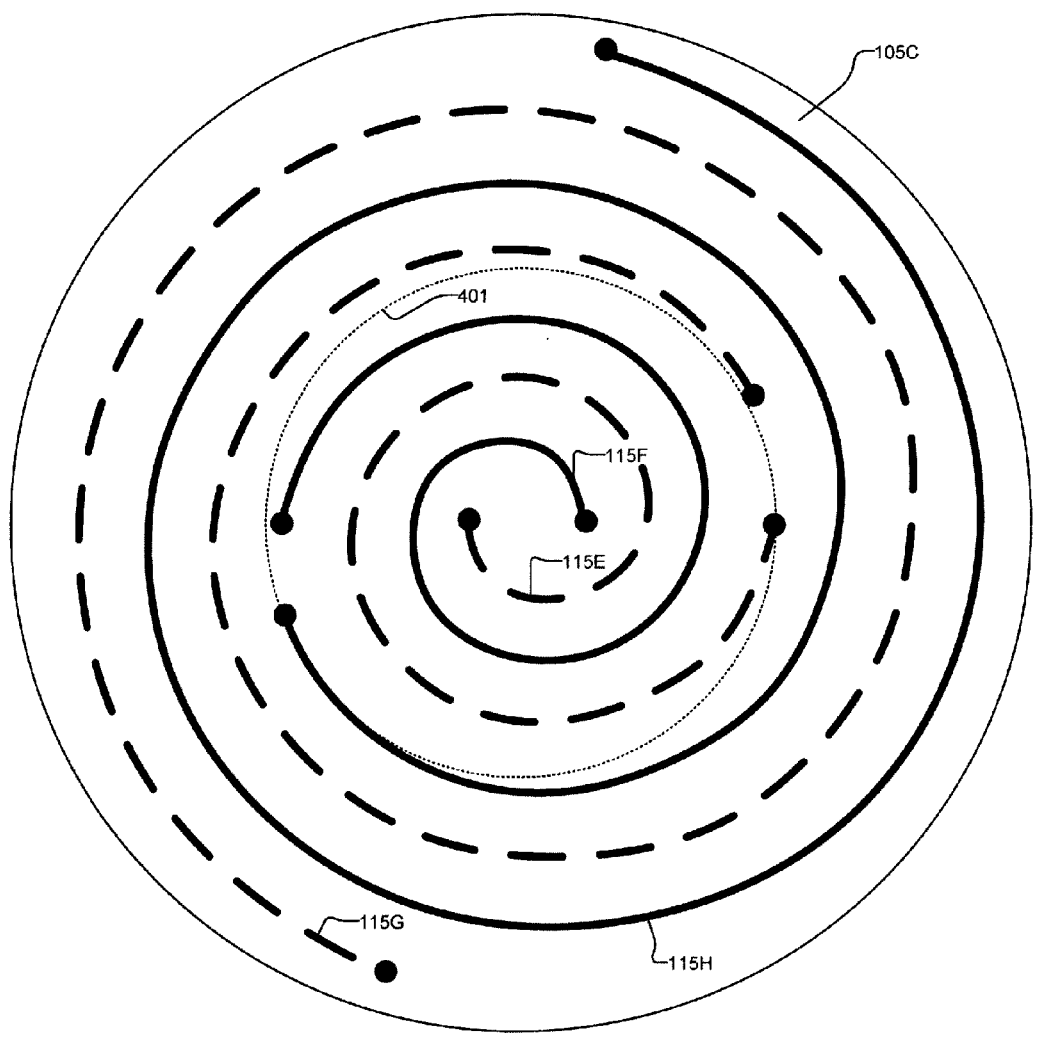
FIG. 2C shows an example coil assembly in which multiple interleaved coil devices are respectively disposed within separate zones, in accordance with one embodiment of the present invention.

FIG. 2C shows an example coil assembly 105C in which multiple interleaved coil devices are respectively disposed within separate zones, in accordance with one embodiment of the present invention. The separate zones in FIG. 2C include an inner zone and an outer zone delineated by a zone boundary 401. The inner zone includes two interleaved coil devices 115E and 115F. The outer zone includes two interleaved coil devices 115G and 115H.

Figure 2D:
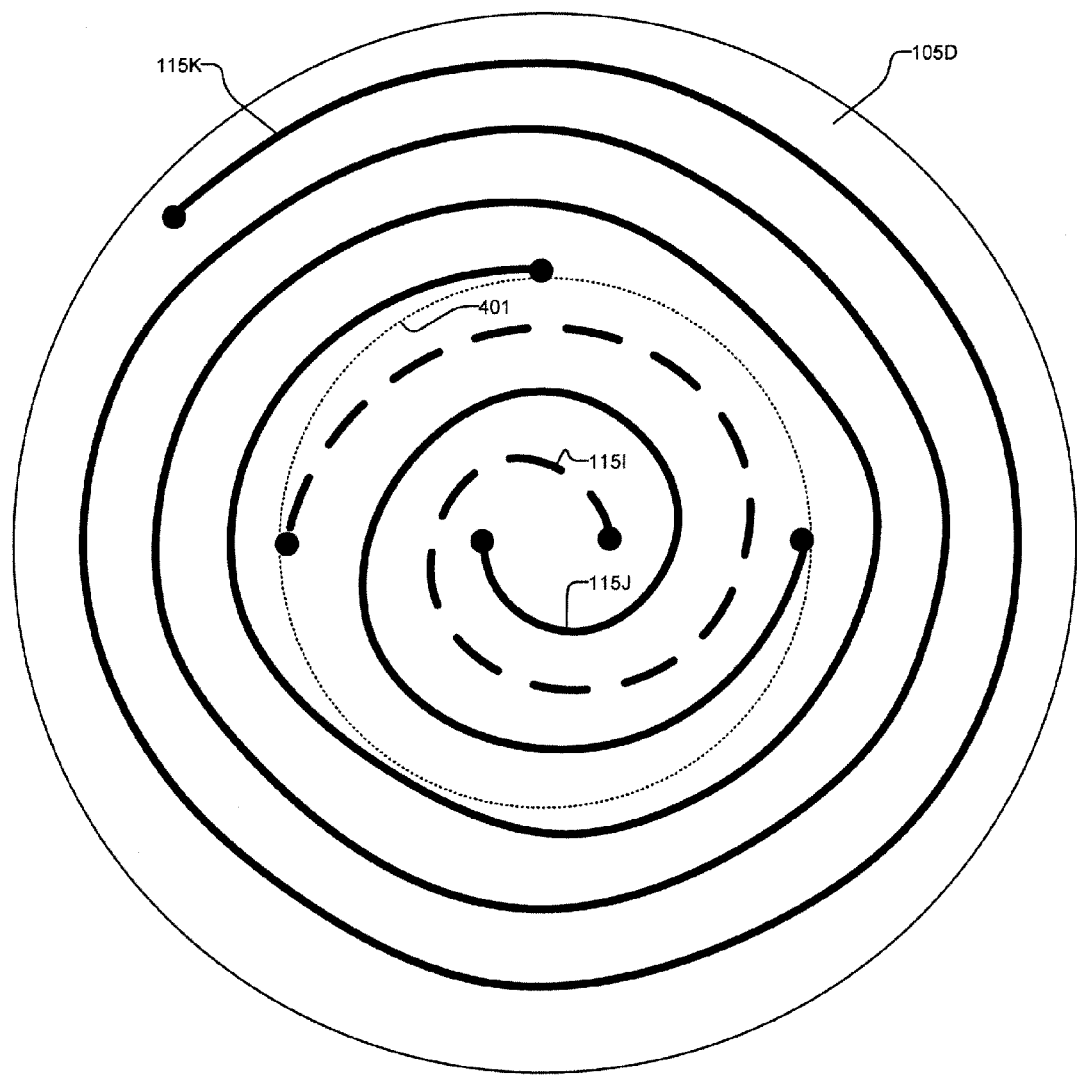
FIG. 2D shows an example coil assembly in which a combination of interleaved and non-interleaved coil devices are disposed within separate zones, in accordance with one embodiment of the present invention.

FIG. 2D shows an example coil assembly 105D in which a combination of interleaved and non-interleaved coil devices are disposed within separate zones, in accordance with one embodiment of the present invention. The separate zones in FIG. 2D include an inner zone and an outer zone delineated by a zone boundary 401. The inner zone includes two interleaved coil devices 115J and 115I. The outer zone includes a non-interleaved coil device 115K.

It should be understood that the number of coil devices and the number of zones illustrated in FIGS. 2A-2D are provided by way of example and do not represent any limitation on either the number of possible coil devices and/or the number of possible zones within the coil assembly 105. In different embodiments, the coil assembly 105 can be formed to include essentially any number of coil devices and/or coil device zones, with essentially any interleaving and/or non-interleaving arrangement of the coil devices. Additionally, in one embodiment, the coil assembly 105 can include an embedded electrode to aid in plasma ignition.

FIG. 3 shows a vertical half cross-section of an alternative coil assembly 105E including a stacked arrangement of coil devices 115, in accordance with one embodiment of the present invention. In this embodiment, the stacked coil devices 115 provide a three-dimensional plasma RF source configuration. It should be understood that the particular coil device 115 stacking arrangement of FIG. 3 is shown by way of example. In other embodiments, a different number of coil device 115 stack levels can be utilized and the spacing between coil devices 115 within a given stack level and between stack levels can be varied in essentially any manner to achieve a desired RF power transmission behavior from the coil assembly 105E. Additionally, the coil device 115 multi-zone and interleaving/non-interleaving arrangements discussed with regard to FIGS. 2A-2D can be applied to any one or more coil device 115 stack levels within the coil assembly 105E embodiment of FIG. 3.

With reference back to FIG. 1A, a cooling fluid supply is defined to flow a cooling fluid through one or more cooling channels within the coil assembly 105. In one embodiment, the electrically conductive tubing material of the coil device 115 is defined to accommodate a flow of cooling fluid therethrough. In this embodiment, the cooling fluid is supplied to and removed from the coil device 115 through tubing disposed within the interior volume 108 of the cantilevered support 107. In another embodiment, the hermetically sealed region 113 within the encapsulation structure 104, outside of the coil device 115, serves as a cooling channel to contain a flow of the cooling fluid outside of the coil device 115. In this embodiment, the cooling fluid is supplied to and removed from the hermetically sealed region 113 through tubing disposed within the interior volume 108 of the cantilevered support 107.

In yet another embodiment, both the hermetically sealed region 113 and the coil device 115 itself are defined to accommodate respective flows of cooling fluid. In this embodiment, the cooling fluid is supplied to and removed from each of the hermetically sealed region 113 and the coil device 115 through tubing disposed within the interior volume 108 of the cantilevered support 107. Also, in this embodiment, the cooling fluid can be counter-flowed through the hermetically sealed region 113 and the coil device 115 to provide for more uniform temperature control across the coil assembly 105.

FIG. 3 also illustrates another embodiment in which separate cooling fluid channels 301 are formed within the coil assembly 105E through which cooling fluid is flowed. In this embodiment, the cooling fluid is supplied to and removed from the cooling fluid channels 301 through tubing disposed within the interior volume 108 of the cantilevered support 107.

In either of the cooling fluid flow embodiments noted above, the cooling fluid is temperature regulated to enable operation of the coil device 115 at very low temperatures. In one embodiment, a high resistivity cooling fluid, such as fluorinert, can be maintained at very low temperature and flowed through the coil device 115 to create a temperature gradient field for the purpose of managing/driving thermophoresis effects within the internal volume of the chamber 100, enabling management of etch byproducts, and providing another parameter for selectivity control.

With reference back to FIG. 1A, the access port 135B of the encapsulation structure 104 serves as a gas input port defined to receive a flow of a reactant gas from supply line 127 disposed within the interior volume 108 of the cantilevered support 107. The gas input port is fluidly connected to a network of gas flow channels 119 formed within the encapsulation structure 104. The gas flow channels 119 are defined to direct a flow of the reactant gas to a number of gas dispense ports 120 formed in the bottom surface 105A of the coil assembly 105, such that the reactant gas is expelled into the plasma generation region between the bottom surface 105A of the coil assembly 105 and the substrate support structure 101.

It should be understood that the gas flow channels 119 are formed and routed within the coil assembly 105 to supply the reactant gas to multiple gas dispense ports 120 distributed in a substantially uniform manner across the bottom surface 105A of the coil assembly 105. Also, although the example embodiment of FIG. 1A shows one gas input port at the access port 135B, it should be understood that other embodiments can implement more that one gas input port to supply the reactant gas to the gas flow channels 119 within the coil assembly 105. Also, it should be understood that the one or more gas input ports, the network of gas flow channels 119, and the multiple gas dispense ports 120 are fluidly separated from the coil placement region 113 formed within the encapsulation structure 104.

The encapsulation structure 104 also includes a number of through holes/slots 121 formed to extend through the encapsulation structure 104 from the lower region 160 to the upper region 162 of the interior volume of the chamber 100. In other words, the through holes/slots 121 extend from the bottom surface 105A of the coil assembly 105 to the top surface 105B of the coil assembly 105. In one embodiment, the through holes/slots 121 are circular-shaped. In another embodiment, the through holes/slots 121 can be formed as annular channels, each defined to subtend a radial arc through the encapsulation structure 104 about the centerline 102. The through holes/slots 121 provide for exhaust gas flow from the plasma generation volume between the coil assembly 105 and the substrate support structure 101, to the upper region of the chamber 100. As previously mentioned, the exhaust pump 112 and the exhaust pumping port 111 formed within the top structure 100A of the chamber 100 operates to draw gases within the chamber toward the top of the chamber 100.

Because the reactant gases are supplied to the chamber 100 interior volume through the gas dispense ports 120 in the bottom surface 105A of the coil assembly 105, the flow of gases within the chamber will be from the gas dispense ports 120, through the through holes/slots 121 to the exhaust pumping port 111 at the top of the chamber, as indicated by arrows 141. Additionally, gases will flow from the gas dispense ports 120, through the gap between the peripheral side surface 105C of the coil assembly 105 and the chamber side structure 100C, to the exhaust pumping port 111 at the top of the chamber, also as indicated by arrows 141.

The through holes/slots 121 are defined and placed to obtain substantially uniform mass flow across the plasma generation region between the bottom surface 105A of the coil assembly 105 and the substrate support structure 101, i.e., across the substrate 103. Because the exhaust pumping port 111 is formed above the coil assembly 105, and because exhaust through holes/slots 121 are formed through the coil assembly 105, the geometry of the coil assembly 105 is indefinitely scalable. More specifically, a distance across the bottom surface 105A of the coil assembly 105 between a gas dispense port 120 and its adjacent through hole/slot 121 forms a gas flow cell.

The gas dispense ports 120 and through holes/slots 121 can be defined, i.e., sized and spaced apart, within the coil assembly 105 to obtain a substantially uniform gas/mass flow per unit area of the substrate 103. As the coil assembly 105 is changed in size, i.e., increased in diameter, flow cells can be added to the coil assembly 105 as necessary to obtain/maintain the substantially uniform gas/mass flow per unit area of the substrate 103. Therefore, the coil assembly 105 is effectively unlimited in its scalability. Also, sizing and placement of the gas dispense ports 120 and through holes/slots 121 within the coil assembly 105 can be adjusted to provide substrate 103 center-to-edge process tunability.

The coil assembly 105 also includes one or more Faraday shield structures 117 formed within the encapsulation structure 104, so as to be hermetically sealed within the encapsulation structure 104. The Faraday shield structures 117 are formed of an electrically conductive material. In one embodiment, the Faraday shield structures 117 are formed as films/sheets of electrically conducting material. For example, in various embodiments, the Faraday shield structures 117 can be formed of sheet metal, metallic foil, and/or printed using a electrically conductive ink.

The Faraday shield structures 117 are shaped and disposed to suppress adverse electrical effects outside of the coil assembly 105. For example, the Faraday shield structures 117 can be used to reduce capacitive coupling between the coil device 115 and the plasma. The Faraday shields 117 can also be designed to focus discharge (plasma generation). For example, in one embodiment, Faraday shields 117 can be disposed above the coil device 115 and formed in a continuous manner to maximally suppress discharge above the coil assembly 105. And, in one embodiment, Faraday shields 117 can be disposed below the coil device 115 and formed to include radially extending fingers to frustrate current induction by RF fields that are produced by the coil device 115.

In addition, high-permeability inks or foils can be incorporated, i.e., formed or deposited, within the encapsulation structure 104 in order to provide magnetic field management to reduce or minimize parasitic plasma above the encapsulation structure 104. In one embodiment, the high-permeability inks or foils can be formed in a continuous manner to provide maximum magnetic shielding. And, in one embodiment, the high-permeability inks or foils can be formed to include radially extending fingers to limit magnetic field strength within the upper part of the chamber 100 above the encapsulation structure 104, thereby further suppressing the potential for parasitic plasma existence above the encapsulation structure 104. More specifically, the radially extending feature shape of the high-permeability inks or foils can suppress eddy current losses.

In one embodiment, such as shown in FIG. 1A, the high-permeability fingers 199 can be made from a nickel based ink that is screen printed onto one of the layers, e.g., ceramic layers, of the encapsulation structure 104, prior to firing (heating) of the encapsulation structure 104 assembly to fuse together the components of the encapsulation structure 104. In another embodiment, such as shown in FIG. 1A, the high-permeability fingers 199 can be made as a die-cut nickel foil disposed between layers within the encapsulation structure 104. It should be appreciated that embodiments disclosed herein for the Faraday shields 117 and the high-permeability inks/foils are provided by way of example.

It should be understood that both Faraday shielding, i.e., electric shielding, and magnetic shielding can be implemented within the encapsulation structure 104 to suppress both adverse electrical effects and adverse magnetic effects. Also, it should be understood that in other embodiments, the Faraday shields 117 and the high-permeability inks/foils can be implemented within the encapsulation structure 104 in configurations other than the example configurations described herein and still provide effective electric and magnetic shielding performance.

Figure 4:
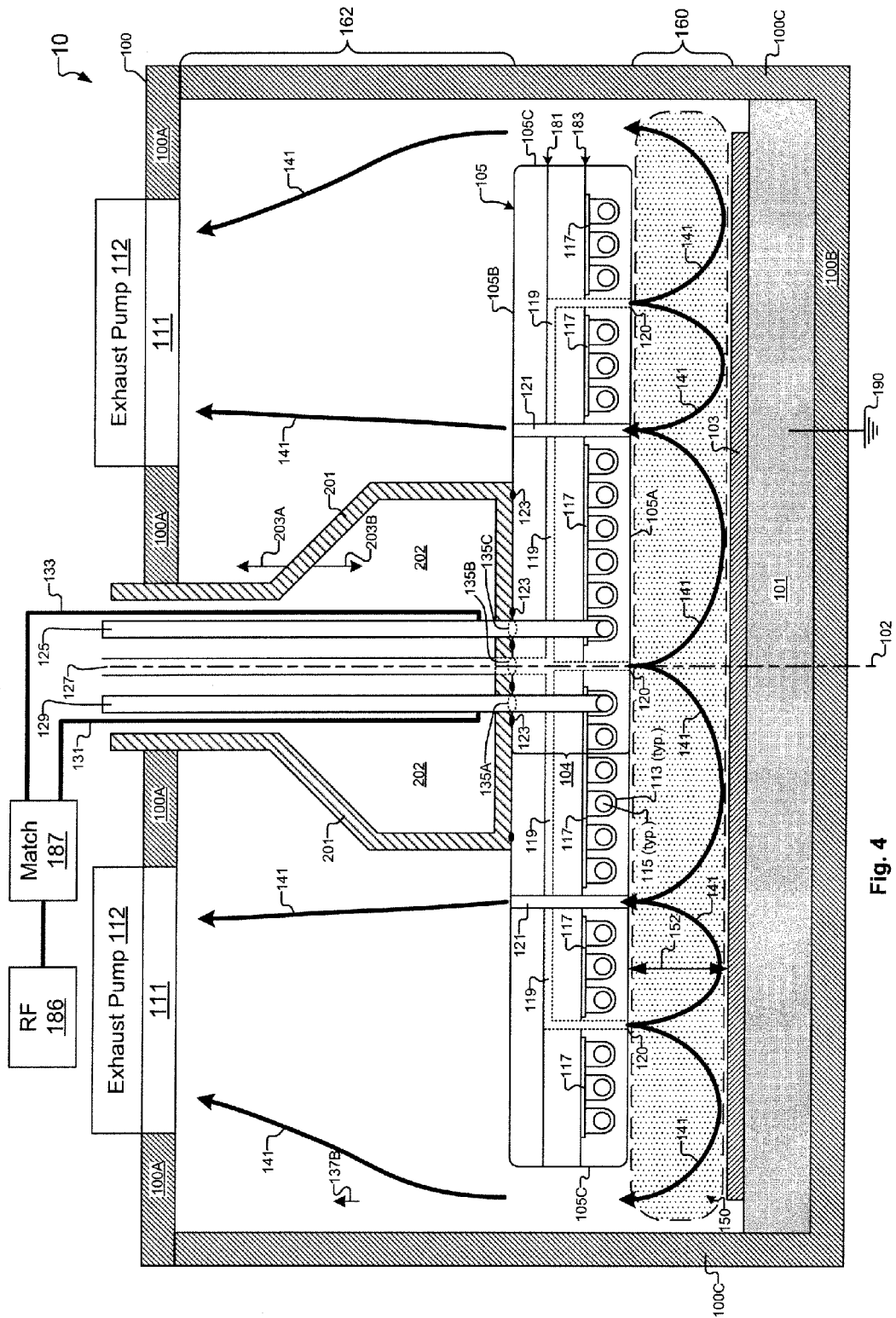
FIG. 4 shows an alternate configuration of the chamber of FIG. 1A, in which the cantilevered support is replaced by a central axial support, in accordance with one embodiment of the present invention.

FIG. 4 shows an alternate configuration of the chamber 100 of FIG. 1A, in which the cantilevered support 107 is replaced by a central axial support 201, in accordance with one embodiment of the present invention. As with the cantilevered support 107, the central axial support 201 is secured to the coil assembly 105 in a sealed manner, such that an interior volume 202 of the central axial support 201 is isolated from the interior volume of the chamber 100. A vertical position of the central axial support 201 within the chamber 100 is adjustable in both upward and downward directions, as indicated by arrows 203A and 203B, respectively, such that the separation distance 152 between the coil assembly 105 and the substrate 103 can be adjusted and controlled.

It should be understood that different embodiments of the chamber 100 may utilize a coil support configuration other than the cantilevered support 107 or the central axial support 201. However, in these different embodiments, the coil support configuration should A) be formed of a material compatible with the plasma processing environment, B) be connected to the top surface 105B of the coil assembly 105 in a sealed manner so as to isolate an interior volume of the coil support from the chamber interior volume, C) be structurally capable of withstanding a pressure differential between the interior volume of the coil support and the chamber interior volume, and D) be vertically adjustable with regard to position so as to enable adjustment of the separation distance 152 between the coil assembly 105 and the substrate 103.

Figure 5:
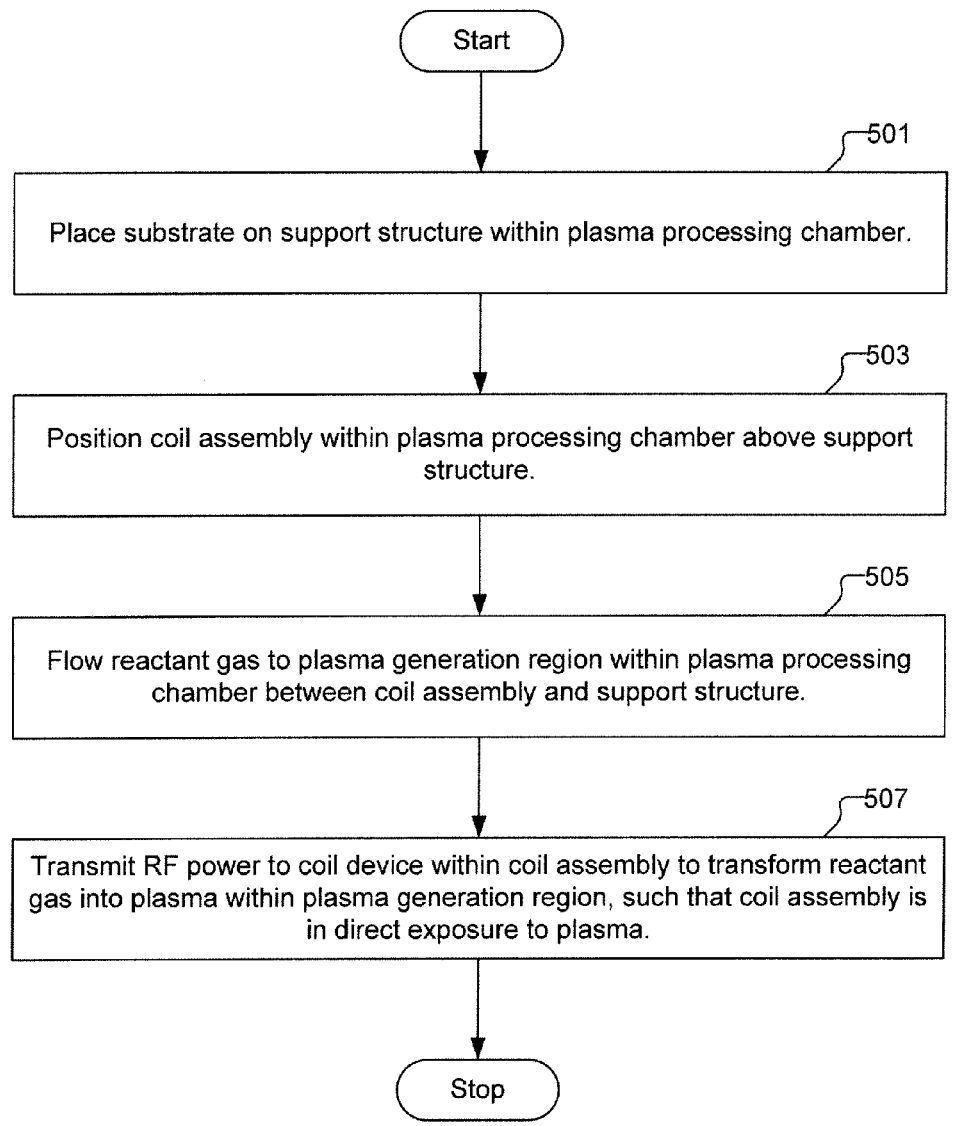
FIG. 5 shows a flowchart of a method for plasma processing of a substrate, in accordance with one embodiment of the present invention.

FIG. 5 shows a flowchart of a method for plasma processing of a substrate, in accordance with one embodiment of the present invention. The method includes an operation 501 for placing a substrate on a support structure within a plasma processing chamber. The method also includes an operation 503 for positioning a coil assembly within the plasma processing chamber above the support structure. The coil assembly includes a coil device disposed within an hermetically sealed region within an encapsulation structure. The encapsulation structure is formed of a material suitable for exposure to a plasma to be generated by the coil device within the plasma processing chamber.

The method also includes an operation 505 for flowing a reactant gas to a plasma generation region within the plasma processing chamber between the coil assembly and the support structure. The reactant gas is flowed through a network of gas flow channels defined within the encapsulation structure of the coil assembly and through a number of gas dispense ports to the plasma generation region. The method further includes an operation 507 for transmitting RF power to the coil device within the coil assembly. The RF power transforms the reactant gas into a plasma within the plasma generation region. It should be appreciated that the coil assembly is in direct exposure to the plasma.

The method can also include an operation for applying a vacuum suction to an exhaust port positioned above the coil assembly to remove gases from within the plasma processing chamber. The method can also include an operation for flowing a cooling fluid through the encapsulation structure such that the cooling fluid is isolated from the plasma generation region. In one embodiment, the coil device is formed of an electrically conductive tubing material, and the cooling fluid is flowed through the coil device. In another embodiment, the cooling fluid is flowed through the hermetically sealed region within the encapsulation structure and outside of the coil device. In yet another embodiment, the coil device is formed of an electrically conductive tubing material, and the cooling fluid is flowed both through the coil device, and through the hermetically sealed region within the encapsulation structure outside of the coil device. In one version of this embodiment, the cooling fluid within the coil device can be flowed in a direction opposite to the flow of cooling fluid within the hermetically sealed region outside of the coil device.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A coil assembly for plasma generation, comprising:
   an encapsulation structure including a bottom ceramic plate having a top surface and a bottom surface, a middle ceramic plate having a top surface and a bottom surface, and a top ceramic plate having a top surface and a bottom surface, the middle ceramic plate positioned between the bottom ceramic plate and the top ceramic plate, the bottom ceramic plate having a coil placement region formed as a trench extending into the bottom ceramic plate from the top surface of the bottom ceramic plate, the coil placement region formed to match a coiled shape of a coil device to be placed within the coil placement region, the trench of the coil placement region formed such that adjacently positioned portions of the coil placement region are separated from each other by ceramic material of the bottom ceramic plate, each of the top and middle ceramic plates including a first access port extending through the top and middle ceramic plates to the coil placement region, each of the top and middle ceramic plates including a second access port extending through the top and middle ceramic plates to the coil placement region, each of the first and second access ports sized large enough to enable the coil device to be placed within the coil placement region to pass through each of the first and second access ports,
   the coil device disposed within the coil placement region of the bottom ceramic plate, the coil device formed to extend from the coil placement region through each of the first and second access ports formed within the middle ceramic plate and the top ceramic plate, wherein the coil placement region is oversized relative to the coil device such that a gap circumscribes the coil device within the coil placement region, wherein the gap within the coil placement region between the coil device and the bottom ceramic plate is exposed through the first and second access ports to an atmospheric pressure environment during operation of the coil assembly for plasma generation; and
   a cantilevered coil assembly support structure connected to the top surface of the top ceramic plate of the encapsulation structure, wherein the cantilevered coil assembly support structure is defined to extend through a side structure of a chamber within which the coil assembly is disposed, wherein the cantilevered coil assembly support structure is hermetically sealed with the top surface of the top ceramic plate of the encapsulation structure around each of the first and second access ports, and wherein an interior volume of the cantilevered coil assembly support structure provides the atmospheric pressure environment to which the gap within the coil placement region is exposed through the first and second access ports.

2. A coil assembly for plasma generation as recited in claim 1, wherein the coil device is formed from an electrically conductive tubing material.

3. A coil assembly for plasma generation as recited in claim 2, wherein the coil device is formed from copper tubing.

4. A coil assembly for plasma generation as recited in claim 2, wherein the electrically conductive tubing material of the coil device is defined to accommodate a flow of cooling fluid therethrough.

5. A coil assembly for plasma generation as recited in claim 1, wherein both the coil placement region and the coil device are defined to accommodate a flow of cooling fluid through the coil placement region outside of the coil device.

6. A coil assembly for plasma generation as recited in claim 1, wherein the encapsulation structure is formed to have a disc shape.

7. A coil assembly for plasma generation as recited in claim 1, wherein the top ceramic plate of the encapsulation structure includes one or more gas input ports defined to receive a flow of a reactant gas, wherein the middle ceramic plate of the encapsulation structure includes a network of gas flow channels in fluid communication with the one or more gas input ports, and wherein the bottom ceramic plate of the encapsulation structure includes multiple gas dispense ports in fluid communication with the network of gas flow channels, wherein each of the multiple gas dispense ports is defined to expel the reactant gas into a plasma generation volume.

8. A coil assembly for plasma generation as recited in claim 7, wherein the encapsulation structure includes a number of through holes or through slots formed to extend from the bottom surface of the bottom ceramic plate to the top surface of the top ceramic plate, wherein the number of through holes or through slots provide for exhaust gas flow from the plasma generation volume.

9. A coil assembly for plasma generation as recited in claim 7, wherein the coil device is connected to receive radiofrequency (RF) power within.

10. A coil assembly for plasma generation as recited in claim 7, wherein the one or more gas input ports, the network of gas flow channels, and the multiple gas dispense ports are fluidly separated from the coil placement region formed within the bottom ceramic plate of the encapsulation structure.

11. A coil assembly for plasma generation as recited in claim 1, further comprising:
   one or more Faraday shield structures disposed over the coil placement region between the bottom ceramic plate and middle ceramic plate so as to be hermetically sealed within the encapsulation structure, wherein the one or more Faraday shield structures are formed of an electrically conductive material and are shaped to suppress adverse electrical effects outside of the coil assembly.

12. A coil assembly for plasma generation as recited in claim 1, further comprising:
one or more inks or foils disposed over the coil placement region between the bottom ceramic plate and middle ceramic plate so as to be hermetically sealed within the encapsulation structure, wherein the one or more inks or foils are formed to suppress adverse magnetic effects outside of the coil assembly.

13. A system for plasma processing of a substrate, comprising:
a chamber having a bottom structure, a top structure, and an enclosing side structure between the bottom and the top structures so as to form an interior volume within the chamber;
a substrate support structure disposed within the interior volume of the chamber, the substrate support structure defined to support a substrate during plasma processing of the substrate;
a cantilevered coil assembly support structure disposed above and substantially parallel to the substrate support structure within the chamber, wherein the cantilevered coil assembly support structure is defined to extend through the enclosing side structure of chamber; and
a coil assembly positioned within the interior volume of the chamber and above the substrate support structure, the coil assembly including a coil device disposed within a coil placement region within an encapsulation structure, the encapsulation structure including a bottom ceramic plate having a top surface and a bottom surface, a middle ceramic plate having a top surface and a bottom surface, and a top ceramic plate having a top surface and a bottom surface, the middle ceramic plate positioned between the bottom ceramic plate and the top ceramic plate, the bottom surface of the middle ceramic plate brazed to the top surface of the bottom ceramic plate, the bottom surface of the top ceramic plate brazed to the top surface of the middle ceramic plate, the bottom ceramic plate having the coil placement region formed as a trench extending into the bottom ceramic plate from the top surface of the bottom ceramic plate, the coil placement region formed to match a coiled shape of the coil device to be placed within the coil placement region, each of the top and middle ceramic plates including a first access port extending through the top and middle ceramic plates to the coil placement region, each of the top and middle ceramic plates including a second access port extending through the top and middle ceramic plates to the coil placement region, each of the first and second access ports sized large enough to enable the coil device to pass through each of the first and second access ports, the coil device formed to extend from the coil placement region through each of the first and second access ports formed within the middle ceramic plate and the top ceramic plate, wherein the coil placement region is oversized relative to the coil device such that a gap circumscribes the coil device within the coil placement region, wherein a portion of the top surface of the top ceramic plate of the encapsulation structure is affixed to a bottom surface of the cantilevered coil assembly support structure such that the cantilevered coil assembly support structure is hermetically sealed with the top surface of the top ceramic plate of the encapsulation structure around each of the first and second access ports, and wherein an interior volume of the cantilevered coil assembly support structure provides an atmospheric pressure environment to which the gap within the coil placement region is exposed through the first and second access ports,
wherein the interior volume of the cantilevered coil assembly support structure and the coil placement region within the encapsulation structure are isolated from the interior volume of the chamber.

14. A system for plasma processing of a substrate as recited in claim 13, wherein the substrate support structure is a pedestal.

15. A system for plasma processing of a substrate as recited in claim 13, wherein the substrate support structure is an electrostatic chuck.

16. A system for plasma processing of a substrate as recited in claim 13, wherein the encapsulation structure of the coil assembly is defined to have a disc shape.

17. A system for plasma processing of a substrate as recited in claim 16, wherein the top surface of the top ceramic plate of the encapsulation structure includes one or more gas supply input ports in fluid communication with a network of gas flow channels formed within the middle ceramic plate of the encapsulation structure that are fluidly connected to a number of gas dispense ports located on the bottom surface of the bottom ceramic plate of the encapsulation structure, the number of gas dispense ports defined to expel gas into a plasma generation region within the interior volume of the chamber.

18. A system for plasma processing of a substrate as recited in claim 17, further comprising:
a radiofrequency (RF) power source;
an RF matching device connected to receive RF power from the RF power source; and
a number of electrical conductors defined to extend through the interior volume of the cantilevered coil assembly support structure from the RF matching device to terminals of the coil device so as to convey RF power to the coil device.

19. A system for plasma processing of a substrate as recited in claim 13, wherein the cantilevered coil assembly support structure is defined to withstand a pressure differential between its interior volume and the interior volume of the chamber when the interior volume of the cantilevered coil assembly support structure is exposed to the atmospheric pressure environment as a pressure within the interior volume of the chamber is raised or lowered relative to the atmospheric pressure environment.

20. A system for plasma processing of a substrate as recited in claim 13, wherein the cantilevered coil assembly support structure and coil assembly affixed thereto are defined to be moved through the enclosing side structure of the chamber.

21. A system for plasma processing of a substrate as recited in claim 13, wherein the cantilevered coil assembly support structure is movable in a controlled manner in directions toward and away from the substrate support structure to enable adjustment of a distance between the coil assembly and the substrate support structure.

22. A system for plasma processing of a substrate as recited in claim 13, further comprising:
an exhaust pump fluidly connected to an exhaust pumping port formed in a central location in the top structure of the chamber, wherein the exhaust pump is defined to remove gases from the interior volume within the chamber.

23. A system for plasma processing of a substrate as recited in claim 22, wherein the encapsulation structure includes a number of through holes or through slots formed to extend from the bottom surface of the bottom ceramic plate to the top surface of the top ceramic plate.

24. A system for plasma processing of a substrate as recited in claim 13, further comprising:
a cooling fluid supply defined to flow a cooling fluid through one or more cooling channels within the coil assembly.

25. A system for plasma processing of a substrate as recited in claim 24, wherein the coil device is defined as an electrically conductive tubing material, and wherein an interior of the coil device serves as a cooling channel to contain a flow of the cooling fluid.

26. A system for plasma processing of a substrate as recited in claim 24, wherein the coil placement region within the bottom ceramic plate of the encapsulation structure and outside of the coil device serves as a cooling channel to contain a flow of the cooling fluid outside of the coil device.

27. A system for plasma processing of a substrate as recited in claim 13, wherein the coil assembly includes one or more Faraday shield structures disposed over the coil placement region between the bottom ceramic plate and middle ceramic plate within the encapsulation structure so as to be hermetically sealed within the encapsulation structure, wherein the one or more Faraday shield structures are formed of an electrically conductive material and are shaped to suppress adverse electrical effects outside of the coil assembly.

28. A system for plasma processing of a substrate as recited in claim 13, wherein the coil assembly includes one or more inks or foils disposed over the coil placement region between the bottom ceramic plate and middle ceramic plate within the encapsulation structure so as to be hermetically sealed within the encapsulation structure, wherein the one or more inks or foils are formed to suppress adverse magnetic effects outside of the coil assembly.

29. A method for plasma processing of a substrate, comprising:
placing a substrate on a support structure within a plasma processing chamber;
positioning a coil assembly for plasma generation within the plasma processing chamber above the support structure, wherein the coil assembly comprises—
an encapsulation structure including a bottom ceramic plate having a top surface and a bottom surface, a middle ceramic plate having a top surface and a bottom surface, and a top ceramic plate having a top surface and a bottom surface, the middle ceramic plate positioned between the bottom ceramic plate and the top ceramic plate, the bottom ceramic plate having a coil placement region formed as a trench extending into the bottom ceramic plate from the top surface of the bottom ceramic plate, the coil placement region formed to match a coiled shape of a coil device to be placed within the coil placement region, the trench of the coil placement region formed such that adjacently positioned portions of the coil placement region are separated from each other by ceramic material of the bottom ceramic plate, each of the top and middle ceramic plates including a first access port extending through the top and middle ceramic plates to the coil placement region, each of the top and middle ceramic plates including a second access port extending through the top and middle ceramic plates to the coil placement region, each of the first and second access ports sized large enough to enable the coil device to be placed within the coil placement region to pass through each of the first and second access ports, and
the coil device disposed within the coil placement region of the bottom ceramic plate, the coil device formed to extend from the coil placement region through each of the first and second access ports formed within the middle ceramic plate and the top ceramic plate, wherein the coil placement region is oversized relative to the coil device such that a gap circumscribes the coil device within the coil placement region, wherein the gap within the coil placement region between the coil device and the bottom ceramic plate is exposed through the first and second access ports to an atmospheric pressure environment during operation of the coil assembly for plasma generation, and
a cantilevered coil assembly support structure connected to the to surface of the top ceramic plate of the encapsulation structure, wherein the cantilevered coil assembly support structure is defined to extend through a side structure of a chamber within which the coil assembly is disposed, wherein the cantilevered coil assembly support structure is hermetically sealed with the top surface of the top ceramic plate of the encapsulation structure around each of the first and second access ports, and wherein an interior volume of the cantilevered coil assembly support structure provides the atmospheric pressure environment to which the gap within the coil placement region is exposed through the first and second access ports.

30. A method for plasma processing of a substrate as recited in claim 29, wherein the reactant gas is flowed through a network of gas flow channels defined within the middle ceramic plate of the encapsulation structure of the coil assembly and through a number of gas dispense ports within the bottom ceramic plate of the encapsulation structure of the coil assembly to the plasma generation region.

31. A method for plasma processing of a substrate as recited in claim 29, further comprising:
applying a vacuum suction to an exhaust port positioned above the coil assembly to remove gases from within the plasma processing chamber.

32. A method for plasma processing of a substrate as recited in claim 29, further comprising:
flowing a cooling fluid through the encapsulation structure such that the cooling fluid is isolated from the plasma generation region.

33. A method for plasma processing of a substrate as recited in claim 32, wherein the coil device is formed of an electrically conductive tubing material, and wherein the cooling fluid is flowed through the coil device.

34. A method for plasma processing of a substrate as recited in claim 32, wherein the cooling fluid is flowed through the coil placement region within the encapsulation structure and outside of the coil device.

\* \* \* \* \*